US012387280B2

(12) United States Patent
Akke et al.

(10) Patent No.: US 12,387,280 B2
(45) Date of Patent: Aug. 12, 2025

(54) METHOD FOR EVALUATING POWER DISTRIBUTING NETWORKS

(71) Applicant: Dlaboratory Sweden AB, Lund (SE)

(72) Inventors: Fredrik Akke, Lidingö (SE); Kewin Erichsen, Malmö (SE)

(73) Assignee: DLABORATORY SWEDEN AB, Lund (SE)

( * ) Notice: Subject to any disclaimer, the term of this patent is extended or adjusted under 35 U.S.C. 154(b) by 377 days.

(21) Appl. No.: 17/987,932

(22) Filed: Nov. 16, 2022

(65) Prior Publication Data
US 2023/0186409 A1    Jun. 15, 2023

(30) Foreign Application Priority Data
Dec. 9, 2021   (SE) .................................. 2151503-6

(51) Int. Cl.
*G06Q 50/06*    (2024.01)
*G01D 7/02*    (2006.01)
(Continued)

(52) U.S. Cl.
CPC ............... *G06Q 50/06* (2013.01); *G01D 7/02* (2013.01); *G01R 19/2513* (2013.01);
(Continued)

(58) Field of Classification Search
None
See application file for complete search history.

(56) References Cited

U.S. PATENT DOCUMENTS 7,050,916 B2 *   5/2006   Curtis ................ G01R 19/2513
                                                                  702/81
8,401,709 B2 *   3/2013   Cherian ............ H02J 13/00017
                                                                  700/291
(Continued)

FOREIGN PATENT DOCUMENTS

CA          2825777 A1 *   8/2012   ............. G06Q 50/00
JP          4088426 B2 *   5/2008   ............. G06Q 10/20

OTHER PUBLICATIONS

Akke et al., "Someim Provements in the Three-Phase Differential Equation Algorithm for Fast Transmission Line Protection", Jan. 1997, IEEE Transactions on Power Delivery, vol. 13, No. 1, Jan. 1998. (Year: 1997).*

(Continued)

*Primary Examiner* — Mohammad Ali
*Assistant Examiner* — Kelvin Booker
(74) *Attorney, Agent, or Firm* — Fredrikson & Byron, P.A.

(57) ABSTRACT

The present invention relates to a method for evaluating power distribution networks, the method comprising frequently sampling an electric parameter value representing the electric parameter value of one phase of a feeder from a power distribution station, detecting the sampled electric parameter value passing a first threshold value in a first direction, detecting the sampled electric parameter value passing a second threshold value in a second direction, being substantially opposite to the first direction, determining an event time period as the time period between the two detections of the electric parameter value passing the first and the second threshold value, calculating a ratio between the determined event time period and a circuit action time period, determining an event score based on the calculated ratio between the determined event time period and the predetermined circuit action time period, accumulating (Continued)

event scores over a reliability check time period, and indicating the reliability of the phase based on accumulated event scores.

20 Claims, 3 Drawing Sheets

(51) Int. Cl.
- *G06Q 10/20* (2023.01)
- *H02J 3/00* (2006.01)
- *H02J 13/00* (2006.01)
- *G01R 19/25* (2006.01)
- *G01R 31/08* (2020.01)

(52) U.S. Cl.
CPC ........... *G01R 31/086* (2013.01); *G06Q 10/20* (2013.01); *H02J 3/00* (2013.01); *H02J 13/00* (2013.01)

(56) References Cited

U.S. PATENT DOCUMENTS

| | | | | |
|---|---|---|---|---|
| 10,355,478 | B2 * | 7/2019 | Shaik | G06Q 10/20 |
| 2002/0154601 | A1 * | 10/2002 | Kawasaki | H04L 67/1001 |
| | | | | 370/395.41 |
| 2005/0033481 | A1 * | 2/2005 | Budhraja | H02J 3/003 |
| | | | | 700/286 |
| 2005/0114057 | A1 * | 5/2005 | Curtis | G01R 19/2513 |
| | | | | 702/81 |
| 2011/0106321 | A1 * | 5/2011 | Cherian | H02J 13/00034 |
| | | | | 700/286 |
| 2017/0331274 | A1 * | 11/2017 | Akke | G01R 31/086 |
| 2018/0074483 | A1 * | 3/2018 | Cruz | G05B 23/0283 |
| 2018/0136288 | A1 | 5/2018 | Wolfe et al. | |
| 2018/0278055 | A1 * | 9/2018 | Shaik | G06Q 10/0635 |
| 2021/0203153 | A1 * | 7/2021 | Akke | H02H 7/26 |
| 2021/0278832 | A1 * | 9/2021 | Koumoto | G05B 23/0218 |

OTHER PUBLICATIONS

Al-Muhaini et al., "A Novel Method for Evaluating Future Power Distribution System Reliability", Jun. 2012, IEEE Transactions on Power Systems, vol. 28, No. 3, Aug. 2013. (Year: 2012).*

Ghiasi et al., "An analytical methodology for reliability assessment and failure analysis in distributed power system", Jun. 2018, Springer Nature Switzerland AG 2018. (Year: 2018).*

Yssaad et al., "Reliability centered maintenance optimization for power distribution systems", Jan. 2012, Electrical Power and Energy Systems 55 (2014) 108-115. (Year: 2012).*

SE Pat. App. No. 2151503-6, Office Action and Search Report dated Jun. 27, 2022, 10 pages (including 3 pages English Translation).

* cited by examiner

METHOD FOR EVALUATING POWER DISTRIBUTING NETWORKS

RELATED APPLICATIONS

This application claims priority to Swedish application No. 2151503-6, filed Dec. 9, 2021, the teachings of which are incorporated herein by reference.

TECHNICAL FIELD

The present invention relates to a method for evaluating power distribution networks.

BACKGROUND

Power distribution systems and power distributing grids are important infrastructures for the modern society. Most of these systems have been around for a long time and have been expanded and modernized during the years. However, there is a risk of the systems being aging, being neglected, and/or that some components of the system fail earlier than expected. Moreover, distributed and/or intermittent power generation, e.g. wind turbines, solar panels, and other smaller power generation sites, is becoming more common which by many is considered an important development for the green energy transition. However, the distributed and intermittent power generation give rise to additional challenges in controlling and running the power grids. Today our civilization is more or less dependent on the reliability of the distribution of electricity and thereby the power distribution systems and power grids. Moreover, most people rely heavily on having access to power for both their work and for leisure activities. Enterprises are also heavily dependent on the resilience of the power distribution systems for their operation. This dependency of power and the reliability of the power distribution grid will probably only increase in the future. Hence, the down time for power distribution systems should be minimized. Maintaining a large grid to keep it reliable, minimizing downtime and avoiding limitations in power transfer is very important for enterprises, individuals, and to society at large. Therefore there is a need facilitating maintenance of power distribution systems and power distribution grids. From the above it is understood that there is room for improvements and the invention aims to solve or at least mitigate the above and other problems.

SUMMARY

One object of the present invention is to facilitate maintenance of power distribution systems.

The invention is defined by the appended independent claims. Additional features and advantages of the concepts disclosed herein are set forth in the description which follows, and in part will be obvious from the description, or may be learned by practice of the described technologies. The features and advantages of the concepts may be realized and obtained by means of the instruments and combinations particularly pointed out in the appended claims. These and other features of the described technologies will become more fully apparent from the following description and appended claims, or may be learned by the practice of the disclosed concepts as set forth herein.

In a first aspect a method for evaluating power distribution networks comprises frequently retrieving an electric parameter value representing the electric parameter value of one phase of a feeder from a power distribution station at a specific point in time, detecting the electric parameter value passing a first threshold value in a first direction, detecting the electric parameter value passing a second threshold value in a second direction, being substantially opposite to the first direction, determining an event time period as the time period between the two detections of the electric parameter value passing the first and the second threshold value, calculating a ratio between the determined event time period and a circuit action time period, determining an event score based on the calculated ratio between the determined event time period and the predetermined circuit action time period, accumulating event scores over a deviation check time period, and indicating the reliability of the phase based on accumulated event scores. One advantage of these features is that the resilience and reliability of portions of the grid may be easily monitored. Moreover, warnings for likely required maintenance may be issued based on the reliability indication. Decisions on maintenance may also be based on the reliability indication. Further advantages with the features may be that the method also take less serious events into consideration, e.g. events that is not so serious that disconnection of the circuit is mandated. Such less serious events may also indicate maintenance issues.

In some embodiments the retrieving of an electric parameter value is performed on all three phases of a feeder from a power distribution station, wherein the determining of an event time period, the calculating of a ratio between the determined event time period and the predetermined circuit action time period, and the determining of an event score based on the calculated ratio is performed for all three phases of a feeder from a power distribution station. One advantage of getting information from all three phases is that a more precise picture of the reliability of a feeder may be achieved.

Some embodiments further comprise retrieving an electric parameter value on the phases of a plurality of feeders from a power distribution station, and wherein event scores are determined for each phase of each feeder for which an event is determined. One advantage of this feature is that a more comprehensive picture of the reliability of the power distribution network may be achieved.

In some embodiments the frequently retrieving an electric parameter value includes frequently sampling an electric quantity and generating the electric parameter value based on the electric quantity, wherein the electric quantity is current or voltage.

In yet some embodiments frequently retrieving an electric parameter value further includes, in addition to sampling a first electric quantity as previously mentioned, frequently sampling a second electric quantity and generating the electric parameter value based on the first and the second electric quantity, wherein the second electric quantity is current or voltage. The advantage of generating the electric parameter value from two different samples may be that further event types may be detected. In particular events that includes comparison of or calculation from two separate measuring points.

Further, the determining of an event time period may be locally processed at the power distribution station. One advantage of such an embodiment may be that data transmission from the distribution station does not require as much bandwidth as if all data samples and/or all electric parameter values would be transmitted to a remote location.

In some embodiments the accumulating of event scores is performed at a server stationed remotely from the power distribution station.

Moreover, determining the event score may be based on a weighting factor and the calculated ratio between the determined event time period and the predetermined circuit action time period. One advantage of introducing a weighting factor may be that event scores from different types of electric parameters may be given differentiated scores, i.e. a value from an electric parameter having more serious impact on the system may be weighted as more important for the accumulation and thereby contributing more to the indication of the reliability of the power distribution network.

In some embodiments the accumulating of event scores includes checking if there are two event scores, each determined from retrieved values, which both have been retrieved within a predetermined time range, and if two such event scores are found, then removing the event score that is less serious from counting in the accumulation of event scores. The advantage of this feature may be that the same error or event is not counted multiple times in the accumulation. Moreover, it also makes it possible to remove events generated based on automatic reconnections, which are performed to evaluate the system after detection of faults that may have disconnected a feeder or a phase.

The two event scores may also have to be relating to the same phase and feeder to be considered for removal from the accumulation.

Moreover the method may include generating a signal indicating low reliability for the network if the accumulated event score is worse than a predetermined reliability score. One advantage of this feature may be that automatic maintenance requests may be generated.

Further, the electric parameter value may be of a type selected from a group including current, residual current, voltage, neutral point voltage, resistance, displacement angle, negative sequence current, phase currents, phase voltages, and line voltages.

In another aspect a computer program comprising software code adapted to perform the above method is considered. The advantages of the features correspond to the advantages of corresponding features in the method.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description. Hence, it is to be understood that this invention is not limited to the particular component parts of the device described or steps of the methods described as such device and method may vary. It is also to be understood that the terminology used herein is for purpose of describing particular embodiments only, and is not intended to be limiting. It must be noted that, as used in the specification and the appended claim, the articles "a," "an," "the," and "said" are intended to mean that there are one or more of the elements unless the context clearly dictates otherwise. Thus, for example, reference to "a sensor" or "the sensor" may include several sensors, and the like. Furthermore, the word "comprising" does not exclude other elements or steps.

BRIEF DESCRIPTION OF THE DRAWINGS

In order to best describe the manner in which the above-described embodiments are implemented, as well as define other advantages and features of the disclosure, a more particular description is provided below and is illustrated in the appended drawings. Understanding that these drawings depict only exemplary embodiments of the invention and are not therefore to be considered to be limiting in scope, the examples will be described and explained with additional specificity and detail through the use of the accompanying drawings in which.

Further, in the figures like reference characters designate like or corresponding parts throughout the several figures.

DETAILED DESCRIPTION

Hereinafter, certain embodiments will be described more fully with reference to the accompanying drawings. It will be apparent to those skilled in the art that various modifications and variations can be made without departing from the inventive concept. Other embodiments will be apparent to those skilled in the art from consideration of the specification and practice disclosed herein. The embodiments herein are provided by way of example so that this disclosure will be thorough and complete, and will fully convey the scope of the inventive concept, and that the claims be construed as encompassing all equivalents of the present inventive concept which are apparent to those skilled in the art to which the inventive concept pertains. If nothing else is stated, different embodiments may be combined with each other.

The present invention relates to a method and system for evaluating power distribution networks. In particular evaluating the reliability of power distribution networks downstream from an evaluation system installed in a power distribution station.

Figure 1:
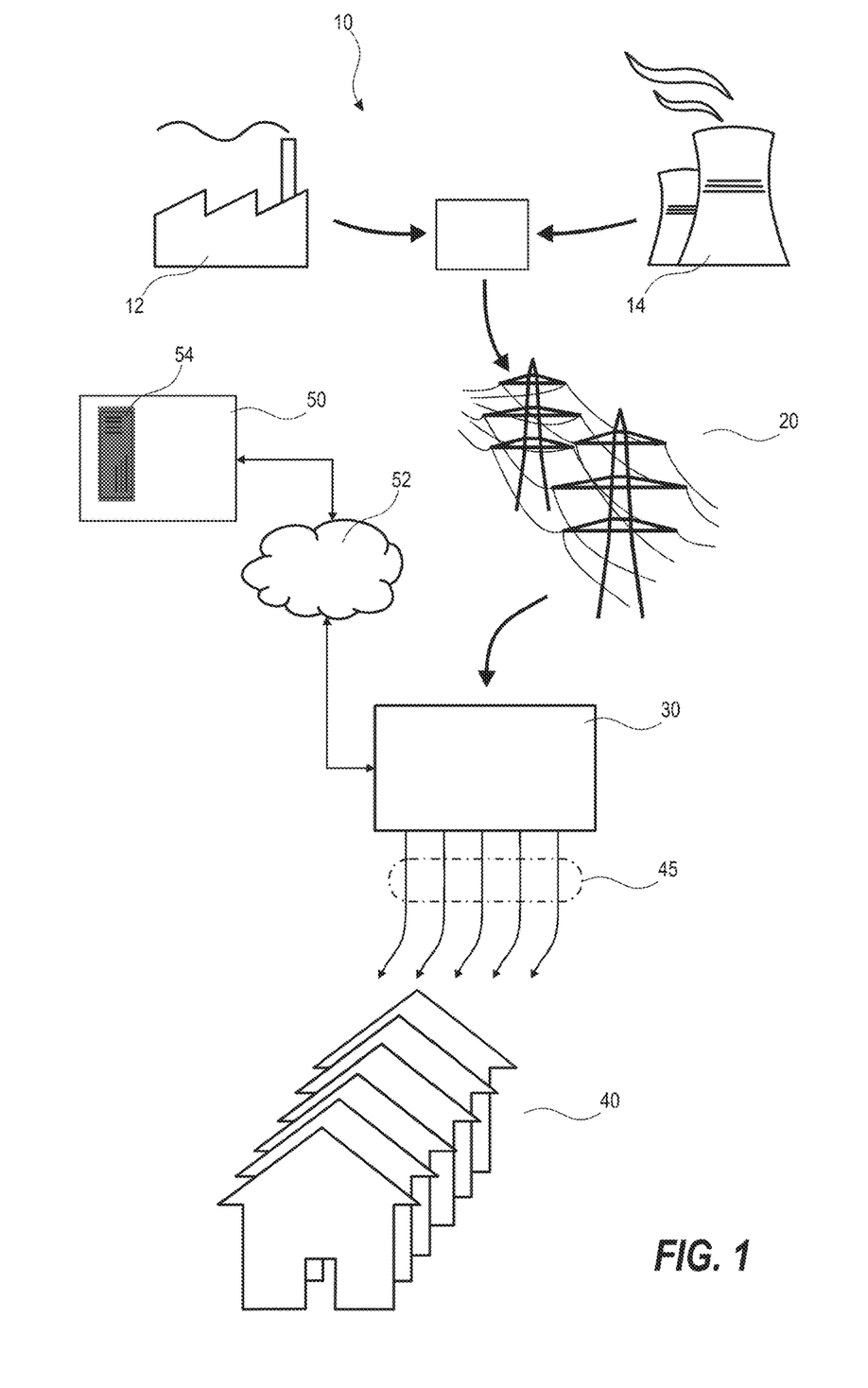
FIG. 1 is a schematic overview of a power distribution system implementing the present invention according to some embodiments.

FIG. 1 illustrates an embodiment of a power distribution grid 10. The power distribution grid 10 includes power generators 12, 14, transmission grid 20, power distribution stations 30, and loads 40. The power generators 12, 14, may be a power plant such as a nuclear power plant 14, a coal power plant 12, a gas power plant, other types of combined heat and power plants, hydro power plant etc. Power generators may also include wind turbines, solar panels. However, most wind turbines, solar panels, smaller combined heat and power plants, and other distributed energy resources are today connected to the load side of a power distribution station, but larger installations may be connected to the transmission grid. The energy from the power generators 12, 14, is fed to transmission grids 20 for distribution to energy consumers, i.e. the loads 40, via a power distribution stations 30. In case of the presence of wind turbines, solar panels, smaller combined heat and power plants, and other distributed energy resources on the load side of a power distribution station, power may flow from the "load side" of the power distribution station 30 as well. The loads 40 may be any electric power consumer such as households, factories, business areas, offices, sports arenas, etc. Some loads, such as some industries, households with solar panels, batteries, and electrical vehicles, may both consume electric power and act as a source of electric power. A power distribution manager or a power distribution company, hereinafter referred to as power distributor, may be responsible and manage at least one power distribution network.

A power distribution network may include at least one power distribution station 30 and an electric grid 45 transferring power from the at least one power distribution station 30 to the loads 40, or it may include a plurality of power stations 30 and electric grids 45 transferring power from each power distribution station 30 to loads 40 of respective power distribution station 30. The electric grid 45 may also be referred to as a distribution grid 45. Alternatively the power distribution network may include at least one power distribution station 30, a plurality of substations, not shown, loads 40 each receiving electric power from a substation, and an electric grid transferring power from power distribution station 30, to substations, and to loads 40. Transmission grids 20 may also be included in a power distribution network. In some embodiments, even one or a plurality of power generators 12, 14, are included in the power distribution network.

In some embodiments at least one power distribution station 30 is connected to a power distribution management system 50 of the power distributor via a communication network 52. The power distribution management system 50 includes at least one central server 54 for receiving, storing, and processing data transmitted from the at least one power distribution station. The central server may be a server located in the cloud, i.e. using a cloud service, it may be a server arranged centrally at the power distribution company, at a company providing this service to the power distribution company, or at a location in the vicinity of a plurality of power distribution stations 30. According to some embodiments a power distribution station 30 is a substation or any other type of power distribution station configured for distributing power in the distribution grid. According to some embodiments the power distribution station may also be a distribution station configured for the transmission grid.

Figure 2:
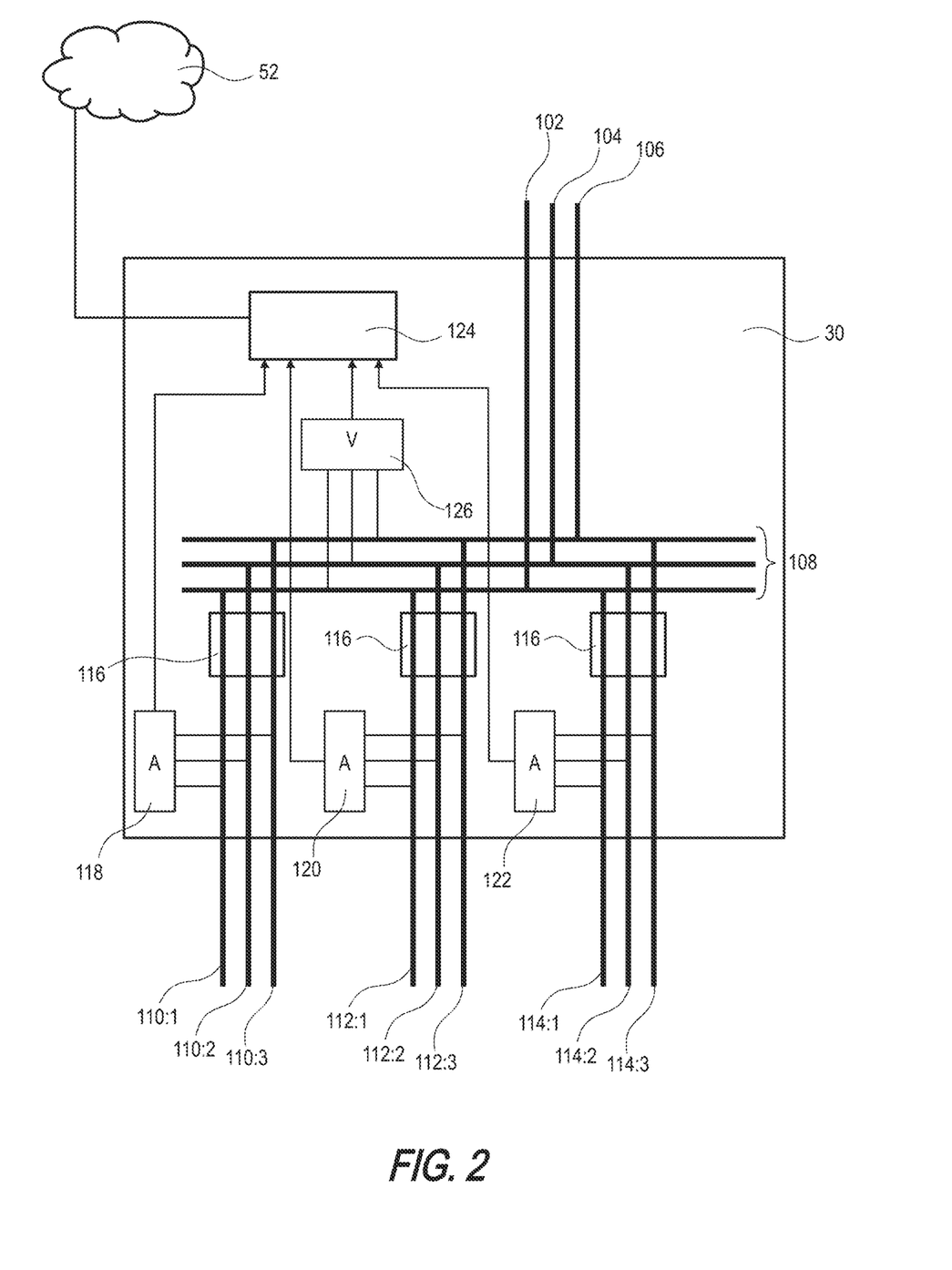
FIG. 2 is a schematic view of a power distribution station according to some embodiments of the invention.

Now referring to FIG. 2, a power distribution station 30 according to some embodiments of the invention receives three-phase power lines 102, 104, 106, from a transmission grid 20, i.e. a first phase 102, a second phase 104 and a third phase 106. The three-phase power lines 102, 104, 106, may then be connected to a three-phase busbar 108 from which the power then may be split into separate feeders 110, 112, 114, each feeding power from the power distribution station 30 to loads 40 via the distribution grid 45. Each feeder 110, 112, 114, includes three power lines representing the first phase 110:1, 112:1, 114:1, the second phase 110:2, 112:2, 114:2, and the third phase 110:3, 112:3, 114:3. The three phases of the feeders 110, 112, 114, may be equipped with a protective relay 116 configured to detect if the feeder 110, 112, 114, is compromised or if the feeder 110, 112, 114, is subject to other dangerous effects and then, if any such situation is detected, break the circuit of the feeder 110, 112, 114, that it is protecting.

In some embodiments the current through each of the phases of at least one of the feeders 110, 112, 114 are measured by a current measuring device 118, 120, 122, e.g. an amperemeter via an instrument transformer. The measured current is sampled either by a sampling unit in the current measuring device 118, 120, 122, or by a sampling unit in a data processing device 124 arranged in the power distribution station 30. The sampling frequency of sampling the current may be in the range of 1000-50000 Hz. In some embodiments the sampling frequency may be 20 kHz. High frequencies like these allows for high resolution and detection of smaller transients. In some embodiments the voltage in the distribution station is measured by a voltage measuring device 126, e.g. a voltmeter via an instrument transformer. The voltage may for instance be measured for each phase at the three-phase busbar 108. The measured voltage is sampled either by a sampling unit in the volt measuring device 126 or by a sampling unit in the data processing device arranged in the power distribution station 30. The sampling frequency of sampling the voltage may be in the same range as for the sampling of the current. In some embodiments the sampling frequency may be 20 kHz. In some applications the sampling frequency for the current and the voltage are advantageously the same frequency.

The data processing device 124 may be a general computer or a special purpose processing device. The processing device may include a processing unit, a volatile memory, a non-volatile memory, a network interface for connecting to the network 52, I/O-ports for receiving data from the current measuring devices 118, 120, 122 and the voltage measuring device.

Figure 3:
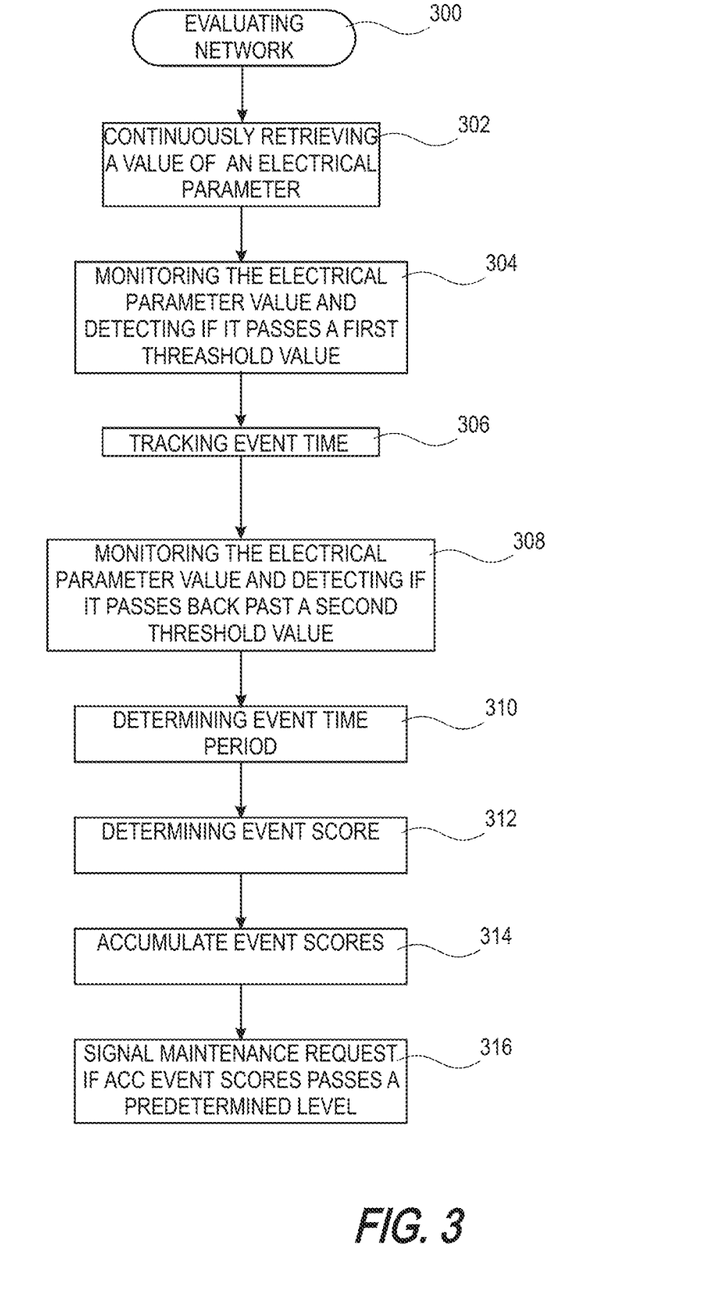
FIG. 3 is a flowchart depicting a method according to some embodiments of the invention.

Now referring to FIG. 3, a process 300 for evaluating power distribution networks may according to some embodiments include retrieving an electric parameter value representing the parameter value for at least one phase of at least one feeder in the distribution station 30, step 302. The retrieving of electric parameters may include sampling an electric quantity, e.g., electric current or voltage. The retrieving may in addition to sampling an electric quantity include some processing of the samples generating a value of an electric parameter from a sequence of samples, e.g. frequency, wavelength, phase angle, etc. Further, the retrieving of an electric parameter may include processing of samples from two or more sampling points or measuring points in the electrical system. These samples of electric quantities may then be processed to calculate the electric parameter. Such electrical parameters may for instance be impedance, power, energy, resistance, etc.

The voltage may be measured at the corresponding phase at the busbar 108 as depicted in FIG. 2. In some embodiments the retrieving of electric parameter values may be performed for all phases of the feeder and in some embodiments a plurality of varying electric parameters may be retrieved. The data processing device 124 may monitor the value of the electric parameter and detecting if the value passes a first threshold value, step 304. For instance, if the electric parameter monitored is current, the process may be set up to detect when the value of the electric current increase above a first threshold value. The threshold value may be a predetermined value. If the value of the electric parameter passes the threshold value a timer is started or a time value for the event of the value of the electric parameter passing the threshold is registered in order to track a duration of the event, step 306. The time that elapses after the value of the electric parameter passes the threshold, i.e. after detecting the event, is referred to as event time. The monitoring of the electric parameter value is continued for detecting when or if the value of the sampled electric value returns past a second threshold value, step 308. For instance, if the electric parameter monitored is current, the process may be set up to detect when the value of the electric current fall back below a second threshold value. The first and second threshold values may be identical values. However, in some embodiments the first and second threshold values differs. For instance, in case of a first threshold value that is triggering detection when the electric parameter value increases past the first threshold value, the second threshold value may be a lower value. Different values of the first and second threshold like this may be advantages in noisy signals in order to avoid that the event time is ended due to a noise related variation in the sampled value.

Determining an event time period for the detected passing of the sampled value past the first threshold value and then back past the second threshold value again, step 310. The determining may simply be that of reading the value of the timer that stopped when the value of the electric parameter changed back past the second threshold value. In some embodiments the determining includes calculating the difference in time between a time value indicating when the value of the electric parameter passed the first threshold value and the time value indicating when the value of the electric parameter passed the second threshold value. When the event time period has been determined the event time is used to calculate a ratio between the event time period and a circuit action time period.

The circuit action time period is a time period set in a circuit protection device, e.g. 100 ms to a few seconds depending on the type of circuit protection device, and is representing the time period allowed for an electric parameter value monitored to deviate from an allowed value of the electric parameter value, counted from the first indication of the electric parameter value deviating from an allowed value. A circuit protection device may be configured to take protective actions on the circuit if the deviating value is present for a time period of at least the circuit action time period. The protective actions taken by the circuit protection device in such cases may, for instance, be breaking the circuit. According to some embodiments the circuit action time period may be the maximum time period an electric parameter value is allowed to be higher or lower, depending on the parameter, than the threshold value. The circuit action time is sometimes referred to as the function time. For instance, in a protective relay the function time (circuit action time) may be in the range of 100 ms to a few seconds.

Then an event score, $S_e$, is determined based on the calculated ratio, r, between the event time period and a circuit action time period, step 312. In some embodiments the event score, in addition to being based on the above-mentioned ratio, is adjusted by a weighting factor, w.

$$S_e = w \cdot r$$

The event scores, $S_e$, are accumulated over a predetermined time period, e.g. a deviation check time period, resulting in an accumulated value that may be used to determine the electric quality of a distribution network, transmission grid, or any type of electrical network that the sampled measures represent, step 314. The event scores, $S_e$, may be accumulated in a sliding window fashion where the window may be a day, a week, or a month, etc., i.e. the accumulation includes values from the past day, week, month, etc. These accumulated event scores may also indicate if the network represented by the event score requires maintenance or not, step 316. Accordingly, a maintenance request may be triggered based on the accumulated event scores.

According to some embodiments the sampling of an electric quantity at one measuring position may provide values for a plurality of different parameters at each sample time or for sequences of samples. Further, as described earlier, the retrieving of an electric parameter value may include sampling of values of an electric quantity or electric quantities from each of the phases in a feeder. In cases where values of electric quantities are sampled from each phase of the feeder additional electric parameters may be determined and/or calculated based not only on samples from each phase, but also on combinations of sampled values from the phases. Electric parameters that may be sampled are any one of electric current and voltage. The event scores, $S_e$, may be accumulated for a single phase, all phases of a feeder, an entire power distribution station, depending on the desired detail level of the information of the system.

The process of accumulating event scores includes, according to some embodiments, checking if two event scores relating to the same feeder is likely to be a result of the same or closely related events. One way of achieving this is to, for each event time period, at least register an event time being the point in time for when the sample triggering the start of the event time period or the sample ending the event time period was sampled. Then checking if the event time for a first one of the two event scores and the event time for a second one of the two event scores is present within the same predetermined time range, i.e. are registered at a temporal distance from each other that is smaller than a predetermined temporal distance. The predetermined time range may be in the range of milliseconds to seconds for some event scores. In some cases, a circuit may be reconnected after an event, e.g. as part of a circuit testing or a troubleshooting of the event behind the previous event score. In such cases the predetermined time range may be 10-20 min. According to some embodiments an event time may be registered as both the point in time triggering the start of the event time period and as the point in time ending the event time period. The checking may in these embodiments include checking if any of the registered time points for the first event score and any of the registered time points for the second event score is present within the same predetermined time range. In both these implementations the process checks if the event scores relate to samples sampled at overlapping time periods or close to each other from a temporal perspective. If two event scores are determined to be relating to the same or closely related event in this way, the event score being less serious, i.e. having less impact on the accumulated score, is not added to the accumulated event score for the feeder.

Electric parameters retrieved may include sampled values and/or processed values. Processed values calculated from a plurality of samples of contributing electric quantities. For instance residual current over three phases may be measured, and thus sampled, directly but may alternatively be calculated from samples of electric current from each phase. Electric parameters that may be considered for retrieval in event detection and event score determination may be related to electric current and/or voltage. Further, the electric parameters may be any one or any plurality of electric parameters from the group including residual current, neutral point voltage, resistance, displacement angle, negative sequence current, phase currents, phase voltages, line voltages.

Events that may be determined based on the sampled and/or calculated electric parameters, direct or indirect, may for example be overcurrent, directional earth fault, non-directional earth fault, neutral point overvoltage, high negative phase sequence current.

In some embodiments an additional threshold is considered for detecting the start of an event. The above discussed first threshold may be implemented to detect the start of a first event, then the additional threshold may be implemented to detect the start of a second event. Wherein the value of the additional threshold may be a value that indicates a worse event than the first event, i.e. the second event is worse than the second event. Further, the circuit action time period may be different for the first event and the second event. Following the reasoning that the second event is worse than the first event the circuit action time period for the second event may be set as a shorter time period than for the first event.

For example, if the electric parameter retrieved is current, the first threshold is at a lower current value than the additional threshold. Hence, if the current passes the additional threshold a more dangerous and serious event is in progress and disconnecting of the circuit may have to be performed very fast in order to avoid hurting people and/or destroying equipment. In some embodiments there may be even further levels of such thresholds.

Additional evaluations may be performed based on the retrieved values. For instance, in some embodiments the voltage may be evaluated for short-term voltage dips and if a short-term voltage dip is detected the event is given an event score. The deeper the detected voltage dip is the worse is the event score given, i.e. the worse event score the less reliability is indicated. Moreover, the longer time period the short-term voltage dip is detected for, the worse is the given event score. The time period for the short-term voltage dip may be detected as described above.

According to some embodiments this detection may be implemented by checking if the sampled voltage drops below a first threshold, e.g. less than 90% of the voltage at normal operation at the measuring point, and then detect when the sampled voltage rises above a second threshold. The first and second thresholds may be the same percentage of the voltage value during normal operation. Alternatively, the second threshold may be higher than the first threshold value, i.e. closer to the voltage of normal operation. The time period for the voltage dropping below the first threshold and rising past the second threshold is measured, as discussed above. This time period is also referred to as the event time period. Then the event score for the shorttime voltage dip may in some embodiments be scored as follows:

If the event time period t is in the range $10\ ms \leq t \leq 200\ ms$ and the voltage v is in the range $90\% > v \geq 40\%$ then the event score will be set to a value corresponding to A, If the event time period t is in the range $10\ ms \leq t \leq 200\ ms$ and the voltage v is in the range $40\% > v > 0\%$ then the event score will be set to a value corresponding to B, If the event time period t is in the range $200\ ms < t \leq 500\ ms$ and the voltage v is in the range $90\% > v \geq 70\%$ then the event score will be set to a value corresponding to A, If the event time period t is in the range $200\ ms < t \leq 500\ ms$ and the voltage v is in the range $70\% > v > 0\%$ then the event score will be set to a value corresponding to B, If the event time period t is in the range $500\ ms < t \leq 1000\ ms$ and the voltage v is in the range $90\% > v > 0\%$ then the event score will be set to a value corresponding to B, If the event time period t is in the range $1000\ ms < t \leq 5000\ ms$ and the voltage v is in the range $90\% > v \geq 40\%$ then the event score will be set to a value corresponding to B, If the event time period t is in the range $1000\ ms < t \leq 5000\ ms$ and the voltage v is in the range $40\% > v > 0\%$ then the event score will be set to a value corresponding to C, If the event time period t is in the range $5000\ ms < t \leq 60000\ ms$ and the voltage v is in the range $90\% > v \geq 70\%$ then the event score will be set to a value corresponding to B, If the event time period t is in the range $5000\ ms < t \leq 60000\ ms$ and the voltage v is in the range $70\% > v > 0\%$ then the event score will be set to a value corresponding to C.

C is a value indicating a worse score than the value indicated by B and B is a value indicating a worse score then the value indicated by A. This scheme is corresponding to the scheme presented in § 6 in EIFS 2013:1 from the Swedish Energy Markets Inspectorate (ISSN 2000-592X). Event scores determined like this may be added to the accumulated score of the power distributing station as described above and be used in determining the resilience and reliability of the power distribution system and possibly if maintenance should be performed. Alternatively, if the voltage dips are resulting from faults in the feeding network from another poser distributor the scores may be used as basis for requesting actions from the other power distributor.

Further evaluations may be performed in the power distribution system. For example, an additional event that may be accumulated in the accumulated event scores is high ohmic earth faults. A high ohmic earth fault event is detected by determining the impedance and if the determined impedance is higher than an impedance threshold the high ohmic earth fault event is generated. Then in connection with the generation of the high ohmic earth fault event an event score is generated for the high ohmic earth fault event. The lower the impedance value determined in connection with the high ohmic earth fault event the worse the event score, i.e. the less reliable is the power distribution system. In some embodiments the event score is calculated as a linear function from the threshold impedance value to an impedance value corresponding to the highest impedance considered relevant for the high ohmic earth fault. Then the event score may be added to the accumulated score in accordance with the steps described earlier in this description. In some embodiments the threshold value is in the range of 3000-5000 ohm and the highest impedance value considered relevant for the high ohmic earth fault is in the range of 25000-50000 ohm.

In some embodiments the process for generating event scores relating to high ohmic earth faults starts when an event is detected, i.e. a predetermined electric parameter is passing a predetermined threshold. Then sampled values relating to the phase or feeder for which the event was detected is sent to the remote managing system for analysis. The sampled quantities may be both the sampled current and the sampled voltage relevant for the related phase or feeder. The samples sent for analysis may be the samples from a predetermined time period after the detection of the start of the event or it may be the samples from the event time period, as discussed above. The analysis of the sampled values relating to the phase or the feeder then includes calculating the impedance of the phase of feeder. The lower impedance value for scoring the high ohmic earth fault may be retrieved from the settings of a protective relay arranged to protect the phase or the feeder. In some embodiments these lower impedance values may be 3000-5000 ohm, as discussed earlier. Then the event score is calculated as a linear function from the lower impedance value, representing the worst score, to the predetermined highest impedance valuer counted, representing the least bad score. The event scores are then adapted to the rest of the event scores monitored and accumulated in order to present a relevant picture of the reliability of the grid.

In some embodiments the detecting of events and the sampling of quantities is performed in the power distribution station 30. When an event is detected, the samples relating to the detected event is sent to the central server 54 where they are analyzed to determine event scores and to make further calculations to detect other events than the event that triggered the initial event. Then the event score or scores are calculated and accumulated, as described above, in the central server for providing an indication of the reliability of the grid. By performing the event detection locally the number of samples that have to be sent to the central server is limited to samples relating to events and thereby the network load from monitoring the grid may be kept low in view of an alternative where all samples where transmitted all the time. In other embodiments even the calculations and analysis are performed at the power distribution station 30 and the resulting event scores are transmitted to the central server 54.

The various embodiments described above are provided by way of illustration only and should not be construed to limit the invention. For example, the principles herein may be applied to any remotely controlled device. Those skilled in the art will readily recognize various modifications and changes that may be made to the present invention without following the example embodiments and applications illustrated and described herein, and without departing from the scope of the present disclosure.

The invention claimed is:

1. A method for evaluating power distribution networks, the method comprising:
frequently retrieving an electric parameter value representing the electric parameter value of one phase of a feeder from a power distribution station at a specific point in time;
detecting the electric parameter value passing a first threshold value in a first direction;
detecting the electric parameter value passing a second threshold value in a second direction, being substantially opposite to the first direction;
determining an event time period as the time period between the two detections of the electric parameter value passing the first and the second threshold value;
calculating a ratio between the determined event time period and a circuit action time period, the circuit action time period representing a time period allowed for the electric parameter value monitored to deviate from an allowed value of the electric parameter value, and counted from a first such deviation;
determining an event score based on the calculated ratio between the determined event time period and the predetermined circuit action time period;
accumulating event scores over a deviation check time period; and
indicating the reliability of the phase based on accumulated event scores.

2. The method according to claim 1, wherein the retrieving an electric parameter value is performed on all three phases of a feeder from a power distribution station, wherein the determining of an event time period, the calculating of a ratio between the determined event time period and the predetermined circuit action time period, and the determining of an event score based on the calculated ratio is performed for all three phases of a feeder from a power distribution station.

3. The method according to claim 2, further comprising retrieving an electric parameter value on the phases of a plurality of feeders from a power distribution station, and wherein event scores are determined for each phase of each feeder for which an event is determined.

4. The method according to claim 3, wherein frequently retrieving an electric parameter value includes frequently sampling an electric quantity and generating the electric parameter value based on the electric quantity, wherein the electric quantity is current or voltage.

5. The method according to claim 3, further comprising generating a signal indicating low reliability for the network if the accumulated event score is worse than a predetermined reliability score.

6. The method according to claim 1, wherein the determining of an event time period is locally processed at the power distribution station.

7. The method according to claim 1, wherein the accumulating of event scores is performed at a server stationed remotely from the power distribution station.

8. The method according to claim 1, wherein determining the event score is based on a weighting factor and the calculated ratio between the determined event time period and the predetermined circuit action time period.

9. The method according to claim 8, wherein the accumulating of event scores includes checking if there are two event scores, each determined from retrieved values, which has been retrieved within a predetermined time range, and if two such event scores are found, then removing the event score that is less serious from counting in the accumulation of event scores.

10. The method according to claim 9, wherein the two event scores also have to be relating to the same phase and feeder to be considered for removal from the accumulation.

11. The method according to claim 1, further comprising generating a signal indicating low reliability for the network if the accumulated event score is worse than a predetermined reliability score.

12. The method according to claim 1, wherein the electric parameter value is of a type selected from a group including current, residual current, voltage, neutral point voltage, resistance, displacement angle, negative sequence current, phase currents, phase voltages, and line voltages.

13. The method according to claim 1, wherein the accumulating of event scores includes checking if there are two event scores, each determined from retrieved values, which has been retrieved within a predetermined time range, and if two such event scores are found, then removing the event score that is less serious from counting in the accumulation of event scores.

14. The method according to claim 13, wherein the two event scores also have to be relating to the same phase and feeder to be considered for removal from the accumulation.

15. The method according to claim 1, wherein frequently retrieving an electric parameter value includes frequently sampling an electric quantity and generating the electric parameter value based on the electric quantity, wherein the electric quantity is current or voltage.

16. The method according to claim 15, wherein frequently retrieving an electric parameter value further includes frequently sampling a second electric quantity and generating the electric parameter value based on the first and the second electric quantity, wherein the second electric quantity is current or voltage.

17. A computer program comprising software code, which, when executed by a computer, causes the computer to perform steps of a method for evaluating power distribution networks, the steps comprising:
frequently retrieving an electric parameter value representing the electric parameter value of one phase of a feeder from a power distribution station at a specific point in time;
detecting the electric parameter value passing a first threshold value in a first direction;
detecting the electric parameter value passing a second threshold value in a second direction, being substantially opposite to the first direction;

determining an event time period as the time period between the two detections of the electric parameter value passing the first and the second threshold value;

calculating a ratio between the determined event time period and a circuit action time period, the circuit action time period representing a time period allowed for the electric parameter value monitored to deviate from an allowed value of the electric parameter value, and counted from a first such deviation;

determining an event score based on the calculated ratio between the determined event time period and the predetermined circuit action time period;

accumulating event scores over a deviation check time period; and indicating the reliability of the phase based on accumulated event scores.

18. The computer program according to claim 17, wherein, the retrieving an electric parameter value is performed on all three phases of a feeder from a power distribution station, wherein the determining of an event time period, the calculating of a ratio between the determined event time period and the predetermined circuit action time period, and the determining of an event score based on the calculated ratio is performed for all three phases of a feeder from a power distribution station.

19. The computer program according to claim 18, wherein the method further comprises a step of retrieving an electric parameter value on the phases of a plurality of feeders from a power distribution station, and wherein event scores are determined for each phase of each feeder for which an event is determined.

20. The computer program according to claim 19, wherein the method further comprises a step of generating a signal indicating low reliability for the network if the accumulated event score is worse than a predetermined reliability score.

* * * * *